US009057762B1

(12) United States Patent
Huang et al.

(10) Patent No.: US 9,057,762 B1
(45) Date of Patent: Jun. 16, 2015

(54) FAULTY CHAINS IDENTIFICATION WITHOUT MASKING CHAIN PATTERNS

(71) Applicant: Mentor Graphics Corporation, Wilsonville, OR (US)

(72) Inventors: Yu Huang, Sudbury, MA (US); Wu-Tung Cheng, Lake Oswego, OR (US); Ruifeng Guo, Portland, OR (US); Manish Sharma, Wilsonville, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 108 days.

(21) Appl. No.: 14/011,995

(22) Filed: Aug. 28, 2013

Related U.S. Application Data

(60) Provisional application No. 61/694,699, filed on Aug. 29, 2012.

(51) Int. Cl.
*G01R 31/28* (2006.01)
*G01R 31/3177* (2006.01)

(52) U.S. Cl.
CPC .................................. *G01R 31/3177* (2013.01)

(58) Field of Classification Search
CPC .................. G01R 31/3177; G01R 31/318569; G01R 31/318547
USPC .......................................... 714/729, 732, 727
See application file for complete search history.

(56) References Cited

U.S. PATENT DOCUMENTS

| | | | | |
|---|---|---|---|---|
| 6,883,115 B2* | 4/2005 | Sanada | ............................ | 714/26 |
| 7,058,869 B2* | 6/2006 | Abdel-Hafez et al. | ......... | 714/729 |
| 7,302,624 B2* | 11/2007 | Rajski et al. | ................... | 714/732 |
| 7,509,550 B2* | 3/2009 | Rajski et al. | ................... | 714/732 |
| 7,729,884 B2* | 6/2010 | Huang et al. | ................... | 702/185 |
| 7,788,561 B2* | 8/2010 | Huang et al. | ................... | 714/729 |
| 7,895,489 B2* | 2/2011 | Rahman | ......................... | 714/729 |

OTHER PUBLICATIONS

Huang, Y.; Chang, W.-T.; and Rajski, J. "Compactor Independent Scan Chain Direct Diagnosis," Proc. International Test Conference (ITC), 2005.
Mitra, S. and Kim, K.S. "X-Compact An Efficient Response Compaction Technique for Test Cost Reduction," Proc. International Test Conference (ITC), pp. 311-320, 2002.
Rajski, J.; Tyszer, J.; Kassab, M.; Mukherjee, N.; Thompson, R.; Tsai, H.; Hertwig, A.; Tamarapalli, N.; Eide, G.; Qian, J. "Embedded Deterministic Test for Low Cost Manufacturing Test," Proc. ITC, pp. 301-310, 2002.
Patel, J.H.; Lumetta, S. and Reddy, S.M. "Application of Saluja-Karpovsky Compactors to Test Responses with Many Unknowns", VTS, pp. 107-112, 2003.

* cited by examiner

*Primary Examiner* — David Ton

(57) ABSTRACT

Aspects of the invention relate to techniques for cycle-based scan chain diagnosis for integrated circuits with embedded compactors. With various implementations of the invention, no-failing-bits output channels of a compactor are first identified based on output data of a test. Next, good scan chains are identified based on scan chains associated with the no-failing-bits output channels. From scan chains other than the good scan chains, analysis of bits outputted from failing-bits output channels per clock cycle is performed to identify suspected faulty scan chains.

18 Claims, 7 Drawing Sheets

Flow chart 500

Flow chart 500

Traverse all the failing cycles in all failed chain patterns.
For each failing cycle that has an essential failing chain, do {

If this essential failing chain $C_i$ appears the first time, push $C_i$ into a list F, and push the observed values of this failing cycle at different channels into a data structure $V_i$ associated with $C_i$.

Else push the observed values of this failing cycle at different channels into $V_i$ associated with $C_i$.
}

For each essential failing chain $C_i$ in the list F, do {
    Report $C_i$ as one faulty chain
    Identify the fault type based on the failing cycle information in $V_i$.
}

FIG. 7

FAULTY CHAINS IDENTIFICATION WITHOUT MASKING CHAIN PATTERNS

RELATED APPLICATIONS

This application claims priority to U.S. Provisional Patent Application No. 61/694,699, filed on Aug. 29, 2012, and naming Yu Huang et al. as inventors, which application is incorporated entirely herein by reference.

FIELD OF THE INVENTION

The present invention relates to the field of integrated circuit (IC) testing technology. Various implementations of the invention may be particularly useful for scan chain diagnosis.

BACKGROUND OF THE INVENTION

Scan-based testing has been widely used in digital circuits as a design-for-test (DFT) technique. Scan elements and related clocking circuitry take up about 30% of silicon area of an IC chip. It is estimated that 50% of chip failures are found to be caused by scan chain defects. Diagnosing scan chain faults is thus important to guide silicon debug, physical failure analysis (PFA), and yield learning process.

Some of the diagnosis techniques are based on algorithmic diagnosis processes. To determine candidates of faulty scan chains/cells (also referred to as suspected faulty scan chains/cells or faulty scan chain/cell suspects), observed failing and passing test responses are analyzed with software-based tools. These techniques are relatively straightforward for circuits that do not utilize compression techniques for testing. For circuits having embedded compression hardware, however, accurate fault diagnosis presents a formidable challenge.

Compression techniques have been widely adopted to handle large volumes of test data and to increase test speed. The implementation of such techniques typically includes inserting some hardware block (which is termed generally a "compactor" for purposes of this disclosure) along the scan path on the output side of a scan-based or partially-scan-based circuit-under-test. The compactor compresses test response data captured by scan chains in the circuit-under-test and outputs a data stream of compacted test responses through a small number of scan-output channels for analysis.

One main category of compactors is based on spatial compression. Examples of spatial compactors include the "EDT compactor" described in Rajski J., et al., "Embedded Deterministic Test for Low-Cost Manufacturing," Proc. ITC 2002, pp. 301-310 (2002), the "X-compactor" described in Mitra S., et al., "X-Compact: An Efficient Response Compaction Technique for Test Cost Reduction," Proc. ITC 2002, pp. 311-320 (2002), and the "I-compactor" described in Patel, J. H., et al., "Application of Saluja-Karpovsky Compactors to Test Responses with Many Unknowns", VTS, pp. 107-112 (2003). Some of these compactors or their variants have been adopted by commercial tools.

To identify faulty scan chains coupled to a compactor, a masking technique may be employed, as disclosed in the family of U.S. Pat. No. 7,729,884, "Compactor independent direct diagnosis of test hardware." FIG. 2 illustrates an example of using a masking technique for chain diagnosis involving a compactor. In the figure, an XOR gate 250 represents a simplified compactor. To observe data unloaded from a scan chain 210, a masking pattern stored in a mask register 260 sets "0" at the second output of a decoder 230. The data shifted out of a scan chain 220 are blocked by an AND gate 280 from combining with those out of the scan chain 210. If the scan chain 210 is a faulty chain with a stuck-at-1 fault, all "1"s will be observed at the output channel of the compactor. Subsequently, a chain diagnosis technique for non-compression testing can be applied.

While straightforward, this masking approach requires extra hardware for masking and associated masking patterns. As seen in the example illustrated in FIG. 2, the extra hardware includes the decoder 230, the mask register 260, and the two AND gates 270-280. It is advantageous to search for techniques that do not increase hardware footprints for testing.

BRIEF SUMMARY OF THE INVENTION

Aspects of the invention relate to techniques for cycle-based scan chain diagnosis for integrated circuits with embedded compactors. With various implementations of the invention, no-failing-bits output channels of a compactor are first identified based on output data of a test. A no-failing-bits output channel is an output channel that outputs no failing bits during the test. The compactor may be an X-compactor, an I-compactor, or a variant thereof.

Next, good scan chains are identified based on scan chains associated with the no-failing-bits output channels. Being associated is referred to being coupled directly or indirectly. A good scan chain is a scan chain that outputs no failing bit. From scan chains other than the good scan chains, analysis of bits outputted from failing-bits output channels per clock cycle is performed to identify suspected faulty scan chains. A failing-bits output channel is an output channel that outputs at least one failing bit during the test. A suspected faulty scan chains can solely account for failing bits failing bits outputted from all output channels in the failing-bits output channels that are associated with the each of the one or more suspected faulty scan chains for at least one clock cycle. The analysis may comprise analyzing the structure of or the compaction function of the compactor In some embodiments of the invention, scan chains other than the good scan chains and the failing-bits output channels are partitioned into groups. In each of the groups, all output channels are associated only with scan chains in the same group while all scan chains are associated only with output channels in the same group. The per-clock-cycle analysis, i.e., analyzing output bits per clock cycle to determine the suspected faulty scan chains, is performed on each of the groups.

The above approach may be applied when hamming distance associated with the compactor is greater than two.

BRIEF DESCRIPTION OF THE DRAWINGS

FIG. 7 illustrates an example of an algorithm for identifying essential faulty scan chains that may be employed by various embodiments of the invention.

DETAILED DESCRIPTION OF THE INVENTION

General Considerations

Various aspects of the present invention relate to cycle-based scan chain diagnosis for integrated circuits with embedded compactors. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "identify" and "analyze" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

Figure 1:
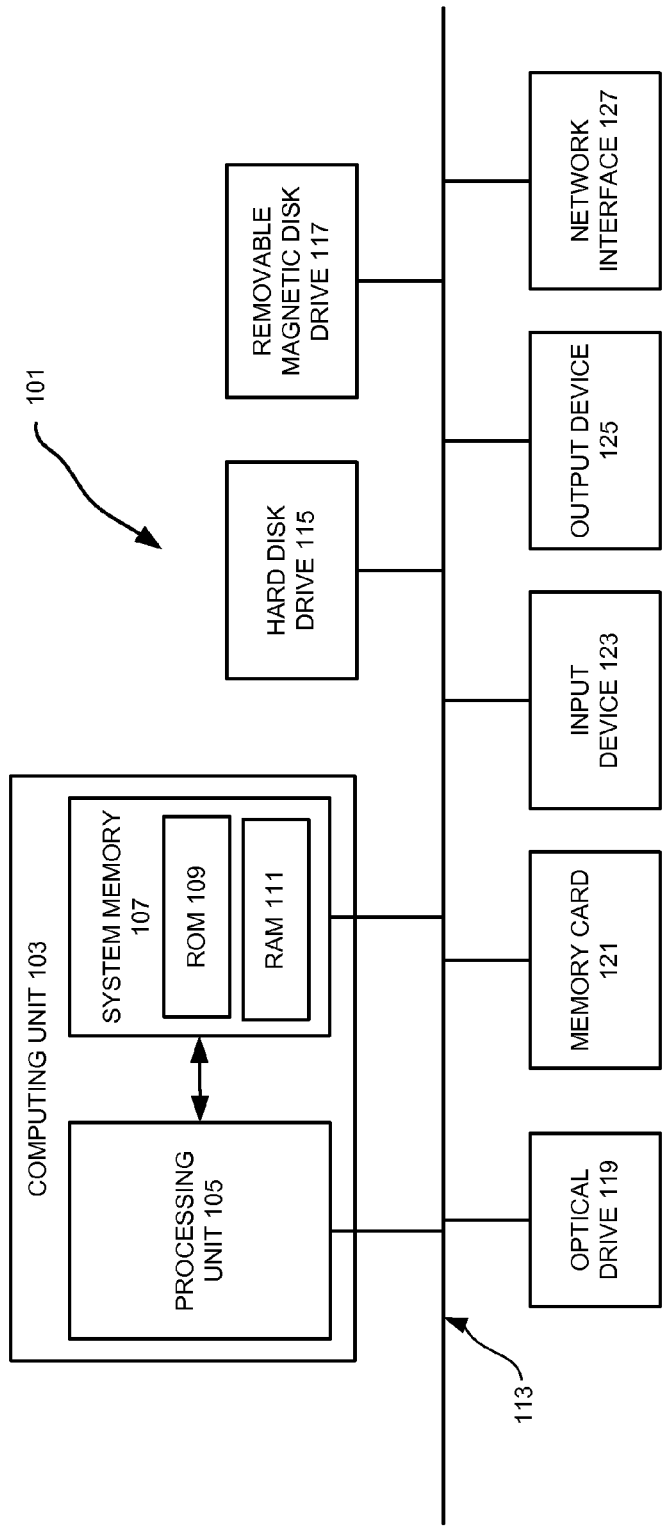
FIG. 1 illustrates a programmable computer system with which various embodiments of the invention may be employed.
Figure 2:
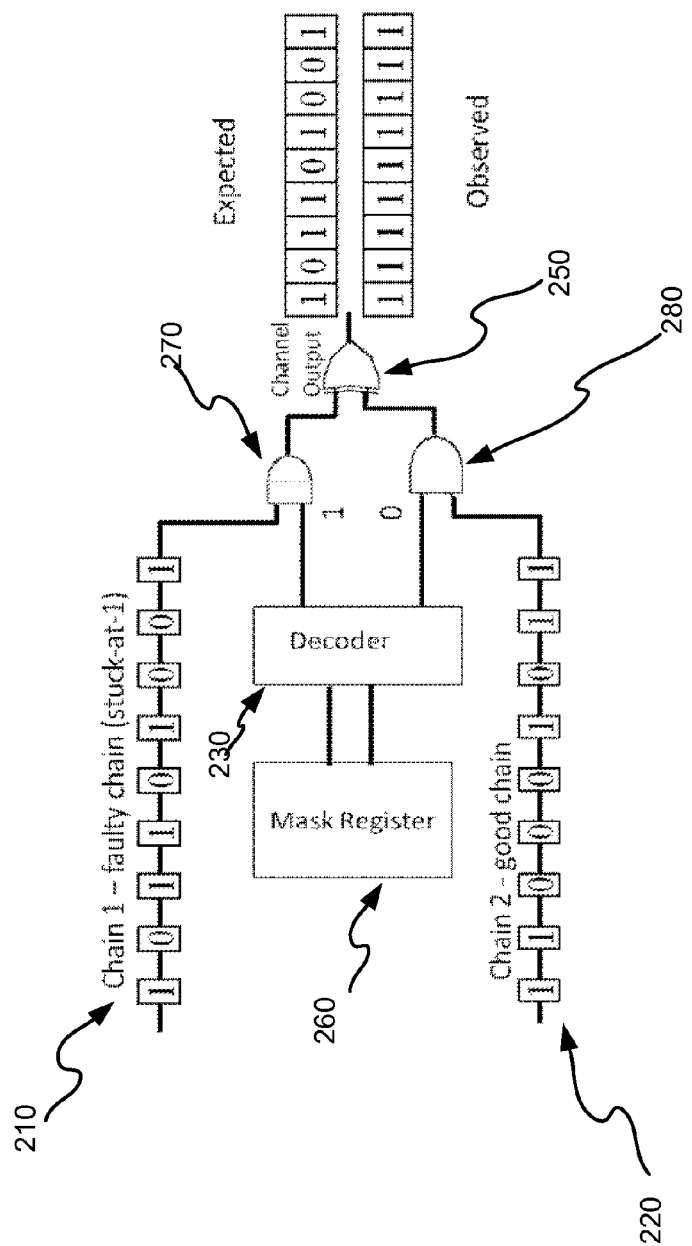
FIG. 2 illustrates an example of using a masking technique for chain diagnosis involving a compactor (prior art).

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Compaction Function And Diagnosis

A compactor can be modeled with a matrix. Assume data unloaded by scan chains is:

$$R = \begin{bmatrix} d_{11} & d_{12} & \ldots & d_{1L} \\ \ldots & \ldots & \ldots & \ldots \\ d_{C1} & d_{C2} & \ldots & d_{CL} \end{bmatrix}$$

where L is the number of clock cycles before compaction, C is the number of scan chains, and $d_{jk}$ is the captured bit ("1" or "0" or "X") by $j^{th}$ scan chain at $k^{th}$ cycle. Assume also the compacted data is:

$$r = \begin{bmatrix} a_{11} & a_{12} & \ldots & a_{1l} \\ \ldots & \ldots & \ldots & \ldots \\ a_{c1} & a_{c2} & \ldots & a_{cl} \end{bmatrix}$$

where l is the number of clock cycles after compaction, c is the number of output channels of the compactor, and $a_{jk}$ is the compacted bit ("1" or "0" or "X") by $j^{th}$ output channel at $k^{th}$ cycle. The transformation operator is denoted as Φ such that Φ(R)=r. This transformation operator Φ is referred to as compaction function. For a spatial compactor, the number of clock cycles after compaction equals the number of clock cycles before compaction: L=1.

Some compactors such as the X-compactor and the I-compactor are designed in such a way that one internal scan chain fans-out to multiple compactor output channels. Under certain situations, this type of compactors allow directly mapping from the failures observed from external scan channels (i.e. compactor output channels) to the internal scan chains by using the error-correcting code property of the compactor. In coding theory, if a compactor is implemented with codes of minimum hamming distance d, up to t errors can be correctly identified in the presence of x unknowns. if 2t+x<d.

Figure 3:
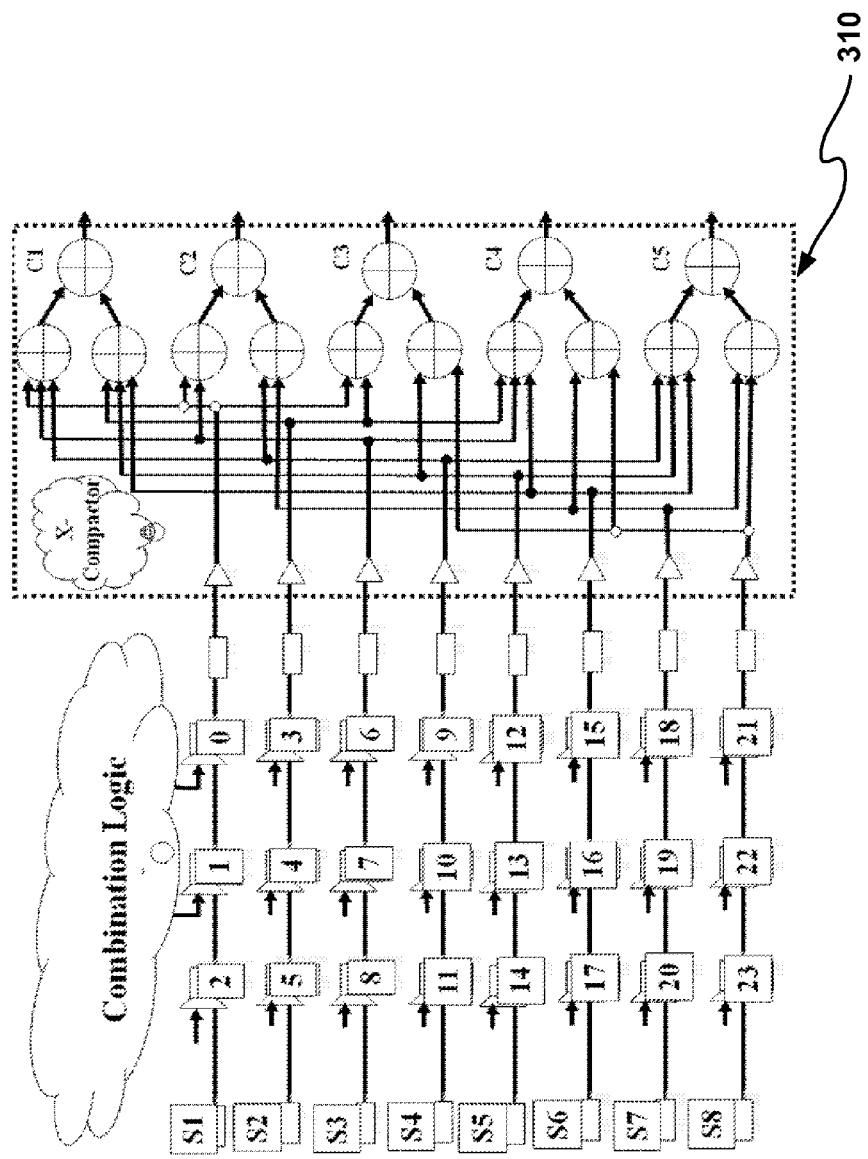
FIG. 3 illustrates an example of an X-compactor that compacts eight scan chains to five output channels.

As illustrated in FIG. 3, for example, an X-compactor 310 has eight scan chains S1-S8 at the input side and five output channels C1-C5. The compaction function for the compactor 310 is:

$$\Phi = \begin{bmatrix} 1 & 1 & 1 & 1 & 1 & 1 & 0 & 0 \\ 1 & 0 & 1 & 1 & 0 & 0 & 1 & 0 \\ 1 & 1 & 0 & 0 & 1 & 0 & 0 & 1 \\ 0 & 1 & 1 & 0 & 0 & 1 & 1 & 1 \\ 0 & 0 & 0 & 1 & 1 & 1 & 1 & 1 \end{bmatrix},$$

The minimum Hamming distance can be derived from the above matrix: d=3. Assume there is only one faulty chain at S1, i.e., t=1. Failures are observed at channels C1, C2 and C3 as S1 fans out to only these 3 channels. The faulty chain can be readily identified as S1 because 2t<d.

If there are two faulty scan chains, however, they cannot be identified by a simple analysis of the compaction function or the compactor structure based on the coding theory. For example, if the two faulty chains are S1 and S2, failures will be observed at channels C1, C2, C3 and C4. It is not difficult to prove that either (S1, S2) or (S1, S3) can cause failures at these 4 channels. Thus, (S1, S2) cannot be uniquely identified as faulty scan chains. This problem can be solved by cycle-based analysis techniques according to various embodiments of the invention which will be discussed below.

Cycle-Based Scan Chain Diagnosis Tools and Methods

Figure 4:
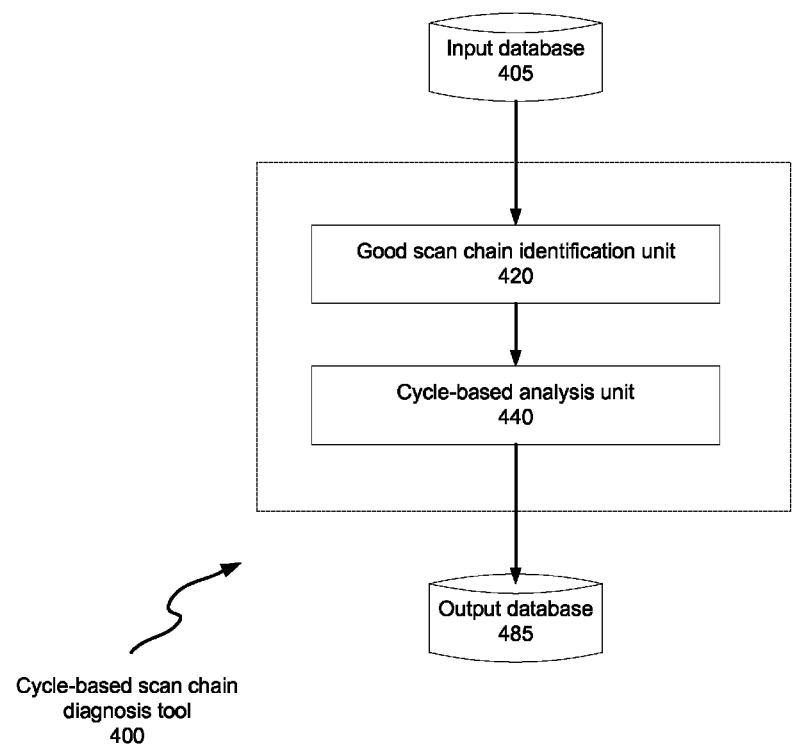
FIG. 4 illustrates an example of a cycle-based scan chain diagnosis tool according to various embodiments of the invention.

FIG. 4 illustrates an example of a cycle-based scan chain diagnosis tool according to various embodiments of the invention. As seen in the figure, the cycle-based scan chain diagnosis tool 400 includes two units: a good scan chain identification unit 420 and a cycle-based analysis unit 440. As will be discussed in more detail below, some implementations of the scan chain stitching tool 400 may cooperate with (or incorporate) one or more of an input database 405 and an output database 485. While the input database 405 and the output database 485 are shown as separate units in FIG. 4, a single data storage medium may be used to implement some or all of these databases.

According to some embodiments of the invention, either or both of the good scan chain identification unit 420 and the cycle-based analysis unit 440 may be implemented by executing programming instructions on one or more programmable computers/computer systems, such as the computing system illustrated in FIG. 1. Correspondingly, some other embodiments of the invention may be implemented by software instructions, stored on a non-transitory computer-readable medium, for instructing one or more programmable computers/computer systems to perform the functions of either or both of the good scan chain identification unit 420 and the cycle-based analysis unit 440. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 5:
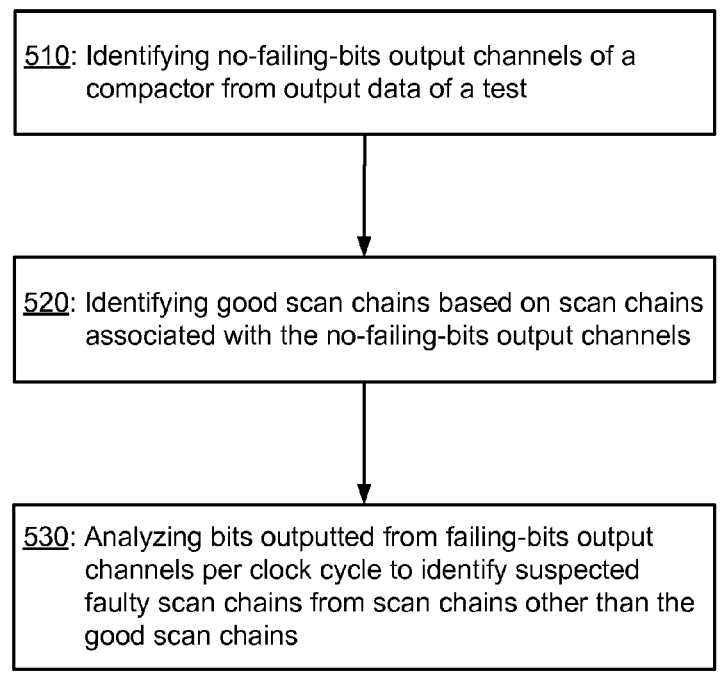
FIG. 5 illustrates a flowchart describing cycle-based scan chain diagnosis methods that may be employed by various embodiments of the invention.

For ease of understanding, cycle-based scan chain diagnosis methods that may be employed according to various embodiments of the invention will be described with reference to the cycle-based scan chain diagnosis tool 400 illustrated in FIG. 4, the flow chart 500 in FIG. 5, the X-compactor system illustrated in FIG. 3 and an example of output data from the X-compactor for three clock cycles illustrates in FIG. 6. It should be appreciated, however, that alternate implementations of a cycle-based scan chain diagnosis tool may be used to perform the method of cycle-based scan chain diagnosis shown in the flow chart 500 according to various embodiments of the invention. In addition, it should be appreciated that implementations of the cycle-based scan chain diagnosis tool 400 may be employed with other methods of cycle-based scan chain diagnosis according to different embodiments of the invention. Moreover, cycle-based scan chain diagnosis methods that may be employed according to various embodiments of the invention can be applied to other compactors including different X-compactors, I-compactors and their variants.

Initially, in operation 510, the good scan chain identification unit 420 identifies no-failing-bits output channels of a compactor based on output data of a test. A no-failing-bits output channel is an output channel that outputs no failing bits during the test. In FIG. 6, the letter "P" indicates a passing bit while the letter "F" indicates a failing bit. Only output channel 5 has no failing bits for all three clock cycles and is thus a no-failing-bits output channel.

Next, in operation 520, the good scan chain identification unit 420 identifies good scan chains based on scan chains associated with the no-failing-bits output channels. A good scan chain is a scan chain that outputs no failing bit. While two failing bits outputted from two faulty scan chains simultaneously may give rise to a passing bit at an output channel, this rarely happens for all clock cycles of the test. It is thus practical to assume a faulty scan chain causes all associated output channels to output a failing bit for at least one clock cycle. Accordingly, all of the scan chains that are associated with the no-failing-bits output channels can be treated as good scan chains. FIG. 3 shows that the no-failing-bits output channel 5 is fed by scan chains S4-S8. The scan chains S4-S8 can be identified as good scan chains.

Next, in operation 530, the cycle-based analysis unit 440 analyzes bits outputted from failing-bits output channels per clock cycle to identify suspected faulty scan chains from scan chains other than the good scan chains. A failing-bits output channel is an output channel that outputs at least one failing bit during the test. In FIG. 6, among the four failing-bits output channels, output channel C1 outputs failing bits at clock cycles 0 and 1, output channel C2 outputs failing bits at clock cycles 0 and 2, output channel C3 outputs failing bits at clock cycles 0 and 1, and output channel C4 outputs failing bits at clock cycles 1 and 2.

Because combinations of failing bits and passing bits for different faulty scan chains may occur with different patterns with respect to clock cycles, it is not unreasonable to assume that there may exist a clock cycle for which failing bits observed at output channels are solely due to a failing bit from a specific faulty scan chain.

Figure 6:
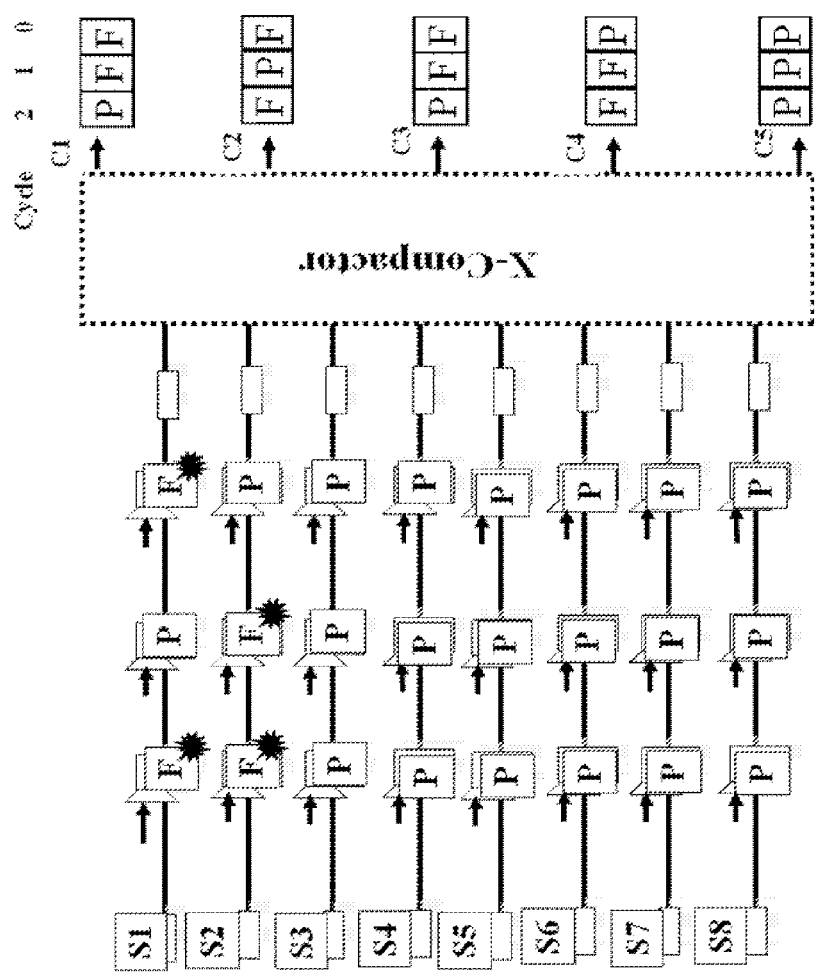
FIG. 6 illustrates an example of data inputted into and outputted from the compactor shown in FIG. 3 for three clock cycles.

In the example illustrated in FIG. 6, at clock cycle 0, failing bits are observed from output channels C1, C2 and C3. If "1" is used to indicate a failing cycle at an output channel and "0" is used to indicate a passing cycle, a system of equations for the compactor can be written as:

$$S_1+S_2+S_3+S_4+S_5+S_6=1$$

$$S_1+S_3+S_4+S_7=1$$

$$S_1+S_2+S_5+S_8=1$$

$$S_2+S_3+S_6+S_7+S_8=0$$

$$S_4+S_5+S_6+S_7+S_8=0$$

It is obvious that only $S_1=1$, and $S_2=S_3=\ldots=S_8=0$ can be the solution. That is. scan chain $S_1$ is a suspected faulty scan chain.

Similarly, a system of equations for the compactor at clock cycle 1 can be written as:

$$S_1+S_2+S_3+S_4+S_5+S_6=1$$

$$S_1+S_3+S_4+S_7=0$$

$$S_1+S_2+S_5+S_8=1$$

$$S_2+S_3+S_6+S_7+S_8=1$$

$$S_4+S_5+S_6+S_7+S_8=0$$

Appearing in all of the equations for output channels outputting a failing bit, scan chain $S_2$ appears to be another suspected faulty scan chain.

At clock cycle 2, only output channels C2 and C4 are failing. Failing bit(s) from either scan chains $S_3$ or the combination of $S_1$ and $S_2$ may be used to explain the observed failing data. This failing cycle is not particularly useful for the operation 530.

FIG. 7 illustrates an example of an algorithm for identifying essential faulty scan chains that may be employed by various embodiments of the invention. An essential faulty scan chain is a suspected faulty scan chain solely responsible for all failing bits observed from output channels for at least one clock cycle.

In some embodiments of the invention, scan chains other than the good scan chains and the failing-bits output channels are partitioned into groups. In each of the groups, all output channels are associated only with scan chains in the same group while all scan chains are associated only with output channels in the same group. The per-clock-cycle analysis, i.e., analyzing output bits per clock cycle to determine the suspected faulty scan chains, is performed on each of the groups.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method, executed by at least one processor of a computer, comprising:
   identifying no-failing-bits output channels of a compactor based on output data of a test, the no-failing-bits output channels outputting no failing bits during the test;
   identifying good scan chains based on scan chains associated with the no-failing-bits output channels; and
   analyzing bits outputted from failing-bits output channels per clock cycle to identify one or more suspected faulty scan chains from scan chains other than the good scan chains, each of the failing-bits output channels outputting at least one failing bit during the test, each of the one or more suspected faulty scan chains solely explaining failing bits outputted from all output channels in the failing-bits output channels that are associated with the each of the one or more suspected faulty scan chains for at least one clock cycle.

2. The method recited in claim 1, wherein the compactor is an X-compactor or its variant.

3. The method recited in claim 1, wherein the compactor is an I-compactor or its variant.

4. The method recited in claim 1, wherein the analyzing comprises:
   analyzing structure or compaction function of the compactor.

5. The method recited in claim 1, wherein the analyzing comprises:
   partitioning scan chains other than the good scan chains and the failing-bits output channels into groups, output channels in each of the groups being associated only with scan chains in the each of the groups and scan chains in each of the groups being associated only with output channels in the each of the groups; and
   performing per-clock-cycle analysis on each of the groups.

6. The method recited in claim 1, being applied when hamming distance is greater than two.

7. One or more non-transitory computer-readable media storing computer-executable instructions for causing one or more processors to perform a method, the method comprising:
   identifying no-failing-bits output channels of a compactor based on output data of a test, the no-failing-bits output channels outputting no failing bits during the test;
   identifying good scan chains based on scan chains associated with the no-failing-bits output channels; and
   analyzing bits outputted from failing-bits output channels per clock cycle to identify one or more suspected faulty scan chains from scan chains other than the good scan chains, each of the failing-bits output channels outputting at least one failing bit during the test, each of the one or more suspected faulty scan chains solely explaining failing bits outputted from all output channels in the failing-bits output channels that are associated with the each of the one or more suspected faulty scan chains for at least one clock cycle.

8. The one or more non-transitory computer-readable media recited in claim 7, wherein the compactor is an X-compactor or its variant.

9. The one or more non-transitory computer-readable media recited in claim 7, wherein the compactor is an I-compactor or its variant.

10. The one or more non-transitory computer-readable media recited in claim 7, wherein the analyzing comprises:
   analyzing structure or compaction function of the compactor.

11. The one or more non-transitory computer-readable media recited in claim 7, wherein the analyzing comprises:
  partitioning scan chains other than the good scan chains and the failing-bits output channels into groups, output channels in each of the groups being associated only with scan chains in the each of the groups and scan chains in each of the groups being associated only with output channels in the each of the groups; and
  performing per-clock-cycle analysis on each of the groups.

12. The one or more non-transitory computer-readable media recited in claim 7, wherein the method is applied when hamming distance is greater than two.

13. A system comprising:
  one or more processors, the one or more processors programmed to perform a method, the method comprising:
  identifying no-failing-bits output channels of a compactor based on output data of a test, the no-failing-bits output channels outputting no failing bits during the test;
  identifying good scan chains based on scan chains associated with the no-failing-bits output channels; and
  analyzing bits outputted from failing-bits output channels per clock cycle to identify one or more suspected faulty scan chains from scan chains other than the good scan chains, each of the failing-bits output channels outputting at least one failing bit during the test, each of the one or more suspected faulty scan chains solely explaining failing bits outputted from all output channels in the failing-bits output channels that are associated with the each of the one or more suspected faulty scan chains for at least one clock cycle.

14. The system recited in claim 13, wherein the compactor is an X-compactor or its variant.

15. The system recited in claim 13, wherein the compactor is an I-compactor or its variant.

16. The system recited in claim 13, wherein the analyzing comprises:
  analyzing structure or compaction function of the compactor.

17. The system recited in claim 13, wherein the analyzing comprises:
  partitioning scan chains other than the good scan chains and the failing-bits output channels into groups, output channels in each of the groups being associated only with scan chains in the each of the groups and scan chains in each of the groups being associated only with output channels in the each of the groups; and
  performing per-clock-cycle analysis on each of the groups.

18. The system recited in claim 13, wherein the method is applied when hamming distance is greater than two.

* * * * *